United States Patent [19]
Tanaka

[11] Patent Number: 5,274,252
[45] Date of Patent: Dec. 28, 1993

[54] LINEARIZING EMITTED LIGHT INTENSITY FROM A LIGHT-EMITTING DEVICE

[75] Inventor: Yukio Tanaka, Yokohama, Japan

[73] Assignee: Eastman Kodak Company, Rochester, N.Y.

[21] Appl. No.: 923,642

[22] Filed: Aug. 3, 1992

[30] Foreign Application Priority Data

Mar. 4, 1992 [JP] Japan ................................. 4-047170

[51] Int. Cl.$^5$ ............................................. H01L 33/00
[52] U.S. Cl. ................................... 257/091; 257/101; 257/102; 257/103
[58] Field of Search ................... 257/101, 88, 91, 93, 257/102, 103

[56] References Cited

U.S. PATENT DOCUMENTS 4,275,403  6/1981  Lebailly ............................ 257/93 X
5,189,496  2/1993  Kuwabara ........................ 257/101 X

FOREIGN PATENT DOCUMENTS 62-250679  10/1987  Japan .

OTHER PUBLICATIONS

Kelly et al., "High-Efficiency Light-Emitting Diode Using Double-Zinc Diffusions," *IBM Technical Disclosure Bulletin*, vol. 14, No. 12, May, 1972, p. 3867.
Bartholomew et al., "Monolithic LED Display Arrays," *IBM Technical Disclosure Bulletin*, vol. 16, No. 1, Jun. 1973, pp. 282-283.

*Primary Examiner*—William Mintel
*Attorney, Agent, or Firm*—Raymond L. Owens

[57] ABSTRACT

A light-emitting device in which at low current levels the increase in light intensity is linear with respect to the increase in current, thereby facilitating control of the light intensity includes a first semiconductor layer in which the semiconductor is of p-type or n-type; a second semiconductor layer that is formed by diffusing into the first semiconductor layer an impurity that is of the other semiconductor type to form a p-n junction; a third semiconductor layer that is of the same semiconductor type as that of the first semiconductor layer that is formed over at least a portion of the second semiconductor layer to reduce the length of the p-n junction on the surface of the device.

3 Claims, 3 Drawing Sheets

LINEARIZING EMITTED LIGHT INTENSITY FROM A LIGHT-EMITTING DEVICE

BACKGROUND OF THE INVENTION

1. Field of the Invention

The present invention relates to a light-emitting device, and more particularly, to a surface emitting type light-emitting device that has a p-n junction.

2. Description of the Prior Art

Light-emitting devices are used in optical printers that use a beam of light to record information, in image and bar-code reading systems that utilize the intensity of a reflected beam of light, and in optical communication devices that utilize optical signals.

FIGS. 7 and 8 show the structure of a conventional light-emitting device. With reference to the drawings, GaAsP containing tellurium is used to form an n-type GaAsP semiconductor layer 3 into which zinc is diffused to form a p-type GaAsP semiconductor layer 1. A positive electrode 4 is then provided on the upper surface of the p-type GaAsP semiconductor layer 1 and a negative electrode 5 on the lower surface of the n-type GaAsP semiconductor layer 3. When these positive and negative electrodes are used to apply a forwardly biased voltage to the junction between the p-type GaAsP semiconductor layer 1 and the n-type GaAsP semiconductor layer 3, the electrical energy is converted into optical energy by the recombination of the majority carriers with the minority carriers injected into the junction, producing an emission of light.

However, applying a forwardly biased voltage produces the relationship between the current flowing in the light-emitting device and the optical output shown by the solid line in the graph of FIG. 9. Namely, while the optical output increases when the current is increased, in low current regions this increase is nonlinear and depends strongly on the current. That is, when a voltage V is applied to the p-n junction, the device current is divided into a component that is proportional to exp(eV/kT) (hereinafter referred to as the type A current component) and a component that is proportional to exp(eV/2kT) (hereinafter referred to as the type B current component). In this case, the intensity of light emitted by the light-emitting device is proportional to the type A current component current. In a high current region, because the type A current component accounts for nearly all of the current the increase in optical output power is linear with respect to the increase in the current. However, when the current is small and the proportion of the current accounted for by type B current component therefore becomes relatively large, the increase in light intensity relative to the increase in current becomes nonlinear.

In a light-emitting device, an increase in light intensity that is non-linear with respect to the increase in current creates problems when it comes to using the current to control the light intensity, in that it makes it difficult to control the light intensity when such light-emitting devices are used as light sources in optical printers, image readers and optical communications devices.

SUMMARY OF THE INVENTION

An object of the present invention is therefore to provide a light-emitting device in which the curved length of the p-n junction extending by a first distance from the surface of the device is reduced to linearize light intensity at low current levels, thereby facilitating control of the light intensity when the light-emitting device is used in various devices.

In accordance with the present invention, this object is attained by a light-emitting device comprising:

a p-n junction formed within a first distance from the device surface between a p-type semiconductor layer and an n-type semiconductor layer in which light emission is produced by applying a forwardly-biased voltage to the junction; and (b) wherein another, semiconductor layer, is provided within a second distance less than the first distance so that the length of a curve formed by the p-n junction of the device is reduced to linearize light intensity at low current levels.

The object is also attained by a light-emitting device comprising:

(a) a first semiconductor layer in which the semiconductor is of p-type or n-type;

(b) a second semiconductor layer that is formed by diffusing into the first semiconductor layer an impurity that induces the other semiconductor type to form a p-n junction; and (c) a third semiconductor layer that is of the same semiconductor type as that of the first semiconductor layer that is formed over at least a portion of the second semiconductor layer to decrease the length of the p-n junction the device.

The object is also attained by a light-emitting device thus constituted as described above, wherein there is a first semiconductor layer in which the semiconductor is of p-type or n-type and in this first semiconductor layer is a second semiconductor layer that is formed by diffusing into the first semiconductor layer an impurity that induces the other semiconductor type, a third semiconductor layer that is of the same semiconductor type as that of the first semiconductor layer is formed on the second semiconductor layer, and an impurity that is of the same semiconductor type as that of the second semiconductor layer is diffused into the third semiconductor layer until the diffusion reaches the second semiconductor layer.

As in the light-emitting device of this invention, the p-n junction is formed so that the length of a curve formed by the p-n junction extending by a first distance from the surface of the device is reduced, reducing the type B current component and thereby making it possible to achieve a linear relationship between the increase in current and the increase in light intensity.

The type B current component is reduced thereby achieving linearity between current increase and increase in light intensity at low current levels, by forming on the second semiconductor layer a semiconductor layer that is of the same conductivity type as that of the first semiconductor layer, or by forming on the second semiconductor layer, a third semiconductor layer that is of the same conductivity type as that of the first semiconductor layer and diffusing into the third semiconductor layer an impurity inducing the same semiconductor type as that of the second semiconductor layer until the diffusion reaches the second semiconductor layer.

Further features of the invention, its nature and various advantages will become more apparent from the accompanying drawings and following detailed description of the invention.

DESCRIPTION OF THE PREFERRED EMBODIMENTS

Figure 1:
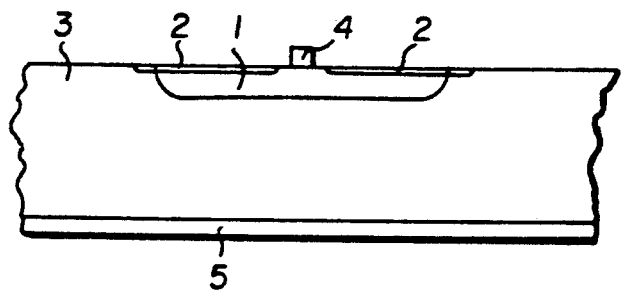
FIG. 1 is a cross-sectional view of a light-emitting device according to a first embodiment of the present invention.
Figure 2:
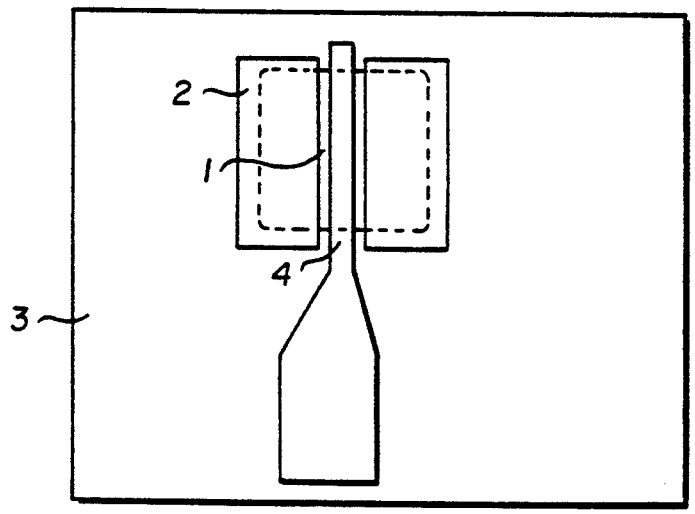
FIG. 2 is a plan view of the light-emitting device according to the first embodiment.
Figure 3:
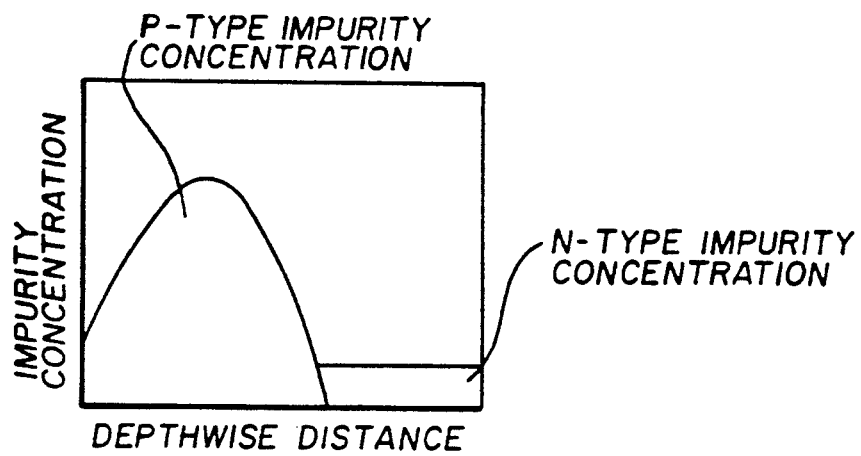
FIG. 3 is a graph of the impurity concentration of a portion where n-type GaAsP semiconductor has not been formed, in the light-emitting device of the first embodiment.
Figure 5:
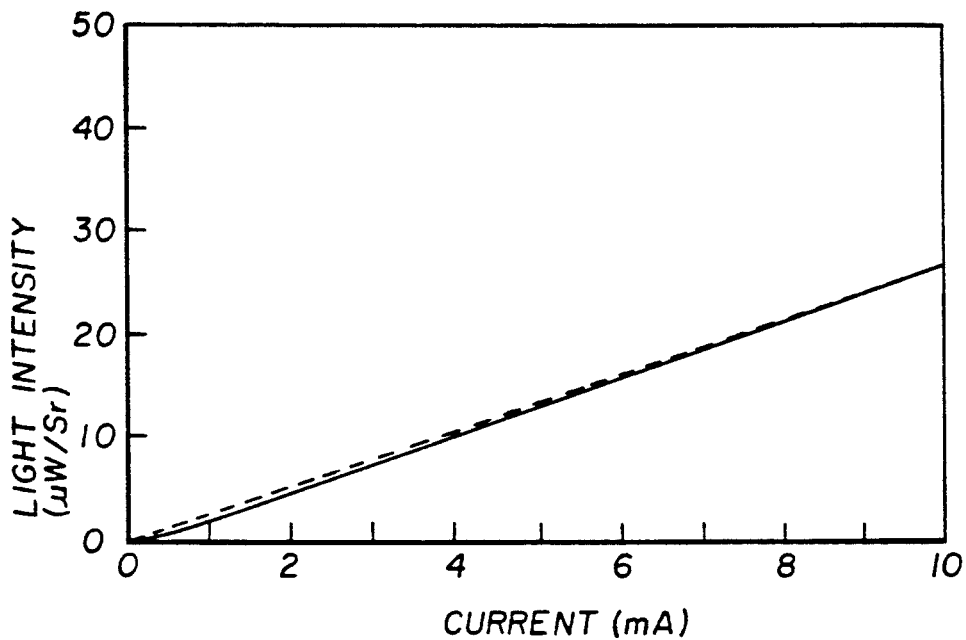
FIG. 5 is a graph showing the relationship between current and light intensity in the light-emitting device of the invention.

With respect of the structure of a light-emitting emitting device according to a first embodiment of this invention, as shown by FIGS. 1 and 2, a GaAsP semiconductor containing tellurium is used to form an n-type GaAsP semiconductor layer 3, and zinc ion implantation is used to form a p-type GaAsP semiconductor layer 1 in the n-type GaAsP semiconductor layer 3. As shown by the graph of FIG. 3, the zinc concentration reaches a maximum at a set distance from the device top surface. A positive electrode 4 is then formed on the top upper surface of the p-type GaAsP semiconductor layer 1 and a negative electrode 5 is formed on the lower surface of the n-type GaAsP semiconductor layer 3 (FIG. 5). The p-n junction extends from the device top surface 8 into the body of the device by a first distance.

Figure 4:
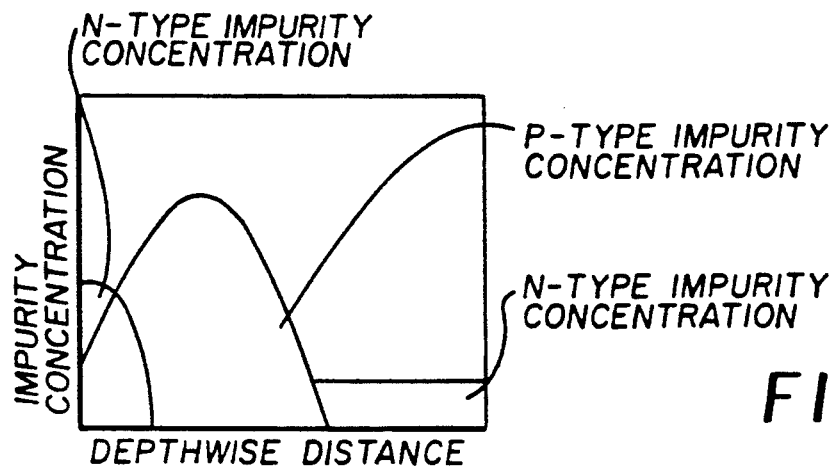
FIG. 4 is a graph of the impurity concentration of a portion where n-type GaAsP semiconductor has been formed, in the light-emitting device of the first embodiment.

In accordance with this invention, by using diffusion or ion implantation of an n-type impurity constituted by n-type GaAsP, a semiconductor layer 2 of n-type GaAsP semiconductor is provided that, except for the positive electrode portion, covers the portion of the p-n junction that is adjacent to the top device surface 8. FIG. 4 shows the impurity concentration distribution at the region of diffusion or ion implantation of the n-type impurity.

The operation of the light-emitting device thus configured will now be described. As has been briefly explained, if the forward-bias voltage that is applied to the light-emitting device's p-n junction is V, the device current is divided into a component that is proportional to exp(eV/kT) (hereinafter referred to as the type A current component) and a component that is proportional to exp(eV/2kT) (hereinafter referred to as the type B current component). The intensity of light emitted by the light-emitting device is proportional to the type A current component current.

When the current is large, that is, when the voltage V is large, the type A current component will account for the major portion of the total current. As the intensity of light emitted by the light-emitting device is proportional to the type A current component, the light intensity will increase linearly with respect to the increase in the device current, with the ratio of increase in optical output power accompanying the increase in the current value having little dependence on the current.

However, under small current conditions, meaning when voltage V is small, it is the type B current component that accounts for a relatively large proportion of the current and the ratio between the type A and B current components therefore depends on the voltage, so the increase in light intensity resulting from an increase in the current becomes nonlinear. Here the type B current component current consists mainly of electron and hole recombinations which occur in the depletion region in the vicinity of the p-n junction exposed on the device surface.

Compared to the structure of conventional light-emitting devices, the provision of the layer of n-type GaAsP semiconductor layer 2 in accordance with this invention decreases the length of the p-n junction adjacent to the surface of the device, thereby enabling the type B current component to be decreased and, as shown by the solid line in the graph of FIG. 5, even in low current regions a linear relationship between the increase in device current and the increase in light intensity can be achieved. The p-n junction is formed between layers 1 and 3 and further extended between layers 1 and 2.

Figure 6:
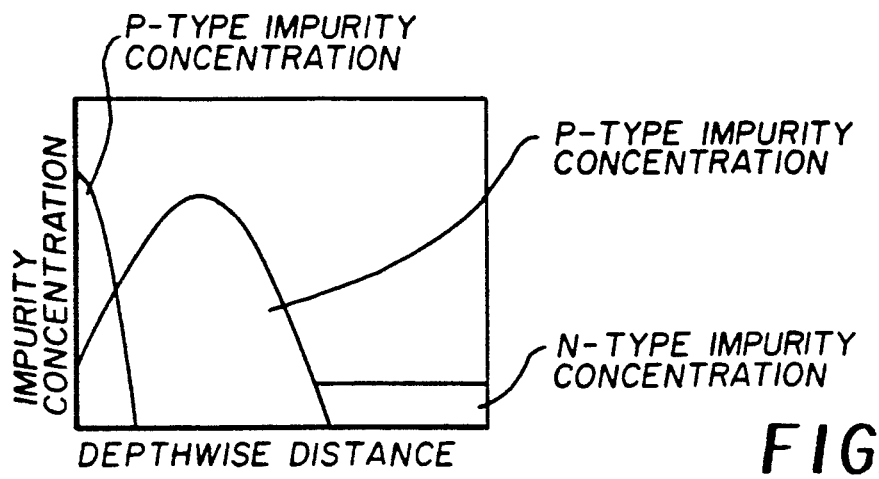
FIG. 6 is a graph of the impurity concentration beneath the positive electrode of a light-emitting device according to a second embodiment of the invention.
Figure 7:
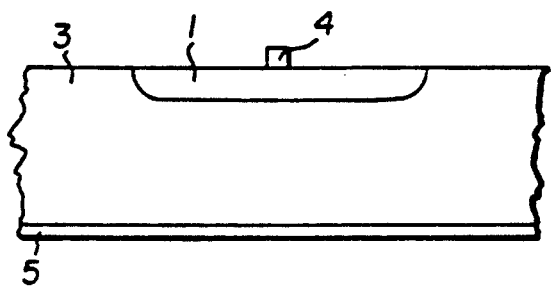
FIG. 7 is a cross-sectional view of a conventional light-emitting device.
Figure 8:
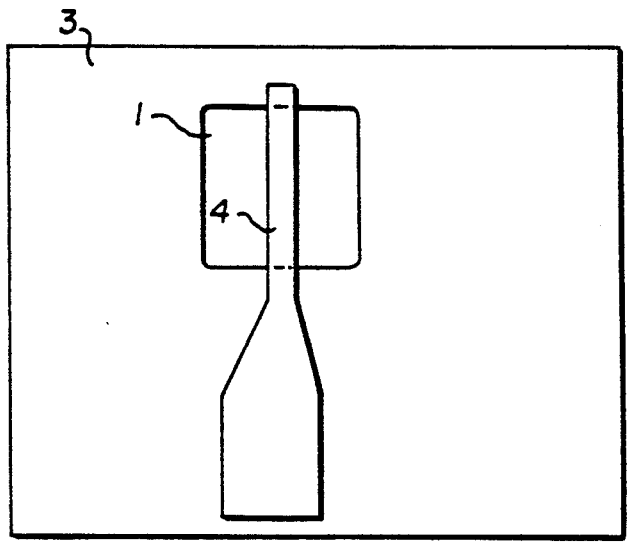
FIG. 8 is a plan view of a conventional light-emitting device.
Figure 9:
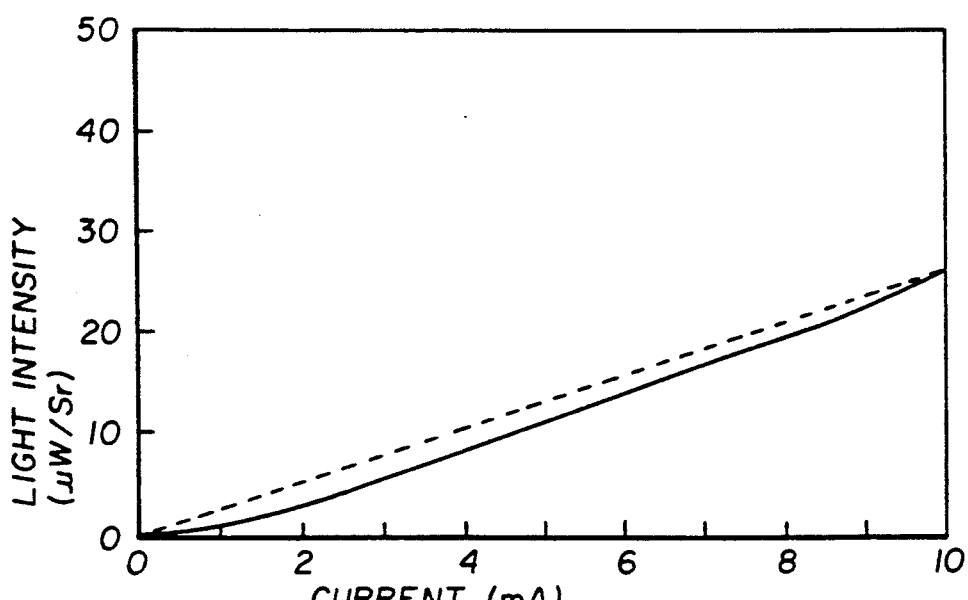
FIG. 9 is a graph showing the relationship between current and light intensity in a conventional light-emitting device.

Although the above embodiment has been described with reference to a light-emitting device in which a p-type semiconductor is formed in an n-type semiconductor, and on this diffusion or ion implantation of an n-type impurity is used to form an n-type semiconductor, except for the positive electrode portion, this invention is not limited thereto. The same effect may also be achieved by an arrangement according to a second embodiment wherein a p-type semiconductor layer is formed in an n-type semiconductor layer, diffusion or ion implantation is used to form an n-type semiconductor layer thereon, and this is followed by diffusion or ion implantation of a p-type impurity at the portion where the positive electrode is formed. The impurity concentration beneath the positive electrode in such a configuration would be as shown by FIG. 6.

Again, while in the above description the n-type semiconductor is GaAsP that contains tellurium, GaAsP containing other elements such as tin, selenium, sulfur, germanium, and silicon may also be used. Similarly, while in the above description the p-type semiconductor is GaAsP that contains zinc, GaAsP containing other elements such as magnesium, manganese, cadmium and the like may also be used.

While, also, in the above description the p-type semiconductor is formed by diffusing a p-type impurity in the n-type semiconductor, an n-type semiconductor layer may instead be formed in the p-type semiconductor. Also, while in the above description GaAsP is used as the p- and n-type semiconductors, it is possible to use other compound semiconductors such as GaAs, GaP, and InGaP, for example.

The invention has been described in detail with particular reference to certain preferred embodiments thereof, but it will be understood that variations and modifications can be effected within the spirit and scope of the invention.

What is claimed is:

1. A light-emitting device having a linear relationship between an electrical current flowing therethrough and the intensity of light emitted therefrom, comprising:
   (a) a p-n junction formed between an n-type conductivity first semiconductor layer and a p-type conductivity second semiconductor layer thereon with a curved length of the junction extending by a first distance from a light-emitting device surface wherein light emission is produced by applying a forwardly biased voltage to the junction; and
   (b) a third semiconductor layer, extending by a second distance less than the first distance, formed on the second semiconductor layer so that the curved length of the p-n junction is reduced to linearize the relationship between electrical current and emitted light intensity.

2. A light-emitting device having a linear relationship between an electrical current flowing therethrough and the intensity of light emitted therefrom, comprising:
   (a) a first semiconductor layer of n-type conductivity;
   (b) a second semiconductor layer formed by diffusing into the first semiconductor layer a p-type conductivity-inducing impurity to form a p-n junction of a curved length extending by a first distance from a light-emitting device surface wherein light emission is produced by applying a forwardly biased voltage to the junction; and
   (c) a third semiconductor layer of n-type conductivity by a second distance less than the first distance, formed over at least a portion of the second semiconductor layer so that the curved length of the p-n junction is reduced to linearize the relationship between electrical current and emitted light intensity.

3. A light-emitting device having a linear relationship between an electrical current flowing therethrough and the intensity of light emitted therefrom, comprising:
   (a) a first semiconductor layer of n-type conductivity;
   (b) a second semiconductor layer formed by diffusing into the first semiconductor layer a p-type conductivity-inducing impurity to form a p-n junction of a curved length extending by a first distance from a light-emitting device surface wherein light emission is produced by applying a forwardly biased voltage to the junction;
   (c) a third semiconductor layer of n-type conductivity, extending by a second distance less than the first distance, formed over the second semiconductor layer so that the curved length of the p-n junction is reduced to linearize the relationship between electrical current and emitted light intensity; and
   (d) a fourth semiconductor layer formed by diffusing into at least a portion of the third semiconductor layer a p-type conductivity-inducing impurity until the fourth semiconductor layer diffusion reaches the second semiconductor layer.

* * * * *